United States Patent
Gattuso et al.

(10) Patent No.: US 6,811,421 B1
(45) Date of Patent: Nov. 2, 2004

(54) SOCKET CONNECTOR WITH PIVOTING OPERATING MEMBERS

(75) Inventors: Andrew Gattuso, Phoenix, AZ (US); Hsiu-Yuan Hsu, Tu-chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/455,921

(22) Filed: Jun. 6, 2003

(51) Int. Cl.[7] .............................................. H01R 11/22
(52) U.S. Cl. ....................................................... 439/266
(58) Field of Search ........................ 439/259, 263–265, 439/268

(56) References Cited

U.S. PATENT DOCUMENTS

| | | | |
|---|---|---|---|
| 4,846,703 A | * | 7/1989 | Matsuoka et al. ............ 439/71 |
| 5,186,642 A | | 2/1993 | Matsuoka et al. |
| 5,690,281 A | | 11/1997 | Tohyama et al. |

* cited by examiner

Primary Examiner—Tho D. Ta
Assistant Examiner—Ann McCamey
(74) Attorney, Agent, or Firm—Wei Te Chung

(57) ABSTRACT

A socket connector (1) includes a base (10), a cover (20), two operating members (60), a lid (30), and four coil springs (40) received between the lid and the base. The base defines passageways (1010) receiving terminals therein. Each operating member includes a first operating lever (601) engaged with the cover, and a second operating lever (602) engaged with the base. The lid is engaged with the operating members for pivotably moving the first and second operating levers thereby the operating members actuating the cover to move in a horizontal direction. When no external force is exerted on the lid, the terminals in the base permit zero insertion force insertion and removal of the leads of the CPU, and when the lid is vertically pushed down, the operating members actuate the cover to move relative to the base thereby connecting the terminals with leads of the CPU.

15 Claims, 6 Drawing Sheets

SOCKET CONNECTOR WITH PIVOTING OPERATING MEMBERS

BACKGROUND OF THE INVENTION

1. Field of the Invention

The present invention relates to an electrical connector such as one used for testing of integrated circuit (IC) packages, and particularly to an electrical connector with a cover and a pair of operating members.

2. Description of Prior Art

Test connectors are widely used for receiving and testing of IC packages. A conventional test connector includes a main body, a movable plate mounted on the main body, and a plurality of operating levers for actuating lateral movement of the movable plate along the main body. The movable plate is movable between a released state in which the IC package is attached thereon but electrically disengaged from terminals in the main body, and a contacting state in which the IC package is electrically engaged with the terminals of the main body. U.S. Pat. Nos. 5,186,642 and 5,690,281 disclose this kind of test connector.

FIG. 6 shows a conventional test connector 9. The connector 9 comprises a base 91, a cover 92, a pair of operating members 95, a pair of coil springs 94, a pair of insert plates 96, and a lid 93. Each operating member 95 comprises a pair of operating levers 950 each defining a receiving hole 951 and a guiding groove 952, a pair of supporting shafts 954 received in the receiving holes 951, and a pair of transmission shafts 955 received in the guiding grooves 952. The base 91 comprises a main body (not labeled) defining, a plurality of passageways 910 receiving a plurality of terminals (not shown) therein. The base 91 defines a pair of blind holes 914 for receiving the coil springs 94. Each of opposite ends of the main body defines a pair of retaining grooves 912, for receiving the supporting shafts 954 of the operating members 95. The cover 92 defines a plurality of passages 920 in a main portion thereof, corresponding to the passageways 910 of the base 91. The cover 92 comprises four projections 922 protruding upwardly from fours corner thereof. A pair of elongated receiving grooves 924 is defined in opposite ends of the cover 92 respectively, at the projections 92. The receiving grooves 924 are for receiving the transmission shafts 955 of the operating members 95. The lid 93 is substantially a rectangular frame, and defines a central opening 930. A pair of receiving recesses (not shown) is defined in bottoms of opposite sidewalls 932 of the lid 93 respectively, for receiving the corresponding insert plates 96 therein.

Referring also to FIG. 7, in assembly, the cover 92 is movably mounted on the base 91. The supporting shafts 954 of the operating members 95 are pivotably received in the retaining grooves 912 of the base 91, and the transmission shafts 955 of the operating members 95 are pivotably received in the receiving grooves 924 of the cover 92. The insert plates 96 are mounted on the operating members 95, and are then fixed in the recesses of the lid 93. The coil springs 94 are mounted between the base 91 and the lid 93. The lid 96 is thereby engaged with the operating members 95 and movably mounted on the base 91.

In use, the lid 93 is pushed downwardly by a robot or an operator's hand (not shown), with corresponding force being applied to the operating members 95. The operating members 95 drive the cover 92 to move horizontally in a direction toward one of the ends of the base 91. When the lid 93 has reached a bottommost position, the coil springs 94 are compressed, and the cover 92 is defined to be in an open state. In the open state, an IC package (not shown) can be attached on the cover 92, with leads of the IC package passing through the passages 920 of the cover 92 and being received in the passageways 910 of the base 91 with zero insertion force (ZIF). That is, when the IC package is attached on the cover 92 in the open state, the leads of the IC package are not in mechanical or electrical engagement with the terminals of the base 91. When said downward pushing by the robot or the operator's hand is released, the coil springs 94 decompress, and the cover 92 is driven horizontally in an opposite direction toward its original position. The leads of the IC package thereby mechanically and electrically engage with the terminals of the base 91. In this position, the cover 92 is defined to be in a closed state.

In the conventional connector 9, if a force of said downward pushing on the lid 93 is insufficient, the cover 92 is driven only part of the way toward the open state. When the IC package is then attached on the cover 92, the leads of the IC package are received in the passageways 910 and interfere with the terminals of the base 91. The leads and the terminals are thus liable to sustain damage. In addition, even when said downward force is sufficient, the shafts 955 are driven to respective endmost portions of the guiding grooves 952, whereat respective walls of the operating levers 952 apply forces on the shafts 955. Smooth movement of the shafts 955 is retarded and interrupted by such forces. Thus, smooth movement of the cover along the base 91 is disrupted, which can result in damage to the leads of the IC package and the terminals of the base 91. Furthermore, in the open state, if said downward force is released suddenly, the coil springs 94 rapidly decompress and drive the lid 93 upwardly, and the cover 92 is quickly driven to the closed state. When this happens, the leads of the IC package enter the terminals of the base 91 with great speed and force, and the leads and the terminals are liable to sustain damage.

A new connector that overcomes the above-mentioned problems is desired.

SUMMARY OF THE INVENTION

An object of the present invention is to provide a connector which prevents or minimizes the risk of damage to leads of an IC package received in the connector.

In order to achieve the above object, a socket connector in accordance with a preferred embodiment of the present invention comprises a base, a cover movably mounted on the base, a pair of operating members, a lid, four coil springs received between the lid and the base, and a pair of insert plates. The base defines a plurality of passageways receiving a plurality of conductive terminals therein. Each operating member comprises a first operating lever engaged with the cover, and a second operating lever engaged with the base. The first and second operating levers are pivotably attached to their respective insert plates, and the insert plates are mounted to the lid respectively. The lid is thereby disposed above the operating members for pivotably moving the first and second operating levers. When no external force is exerted on the connector, the terminals in the base permit zero insertion force insertion and removal of the leads of the IC package, and when the lid is vertically pushed down by an external force, the operating members actuate the cover to move relative to the base thereby connecting the terminals with leads of the CPU.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the invention in detail.

Figure 1:
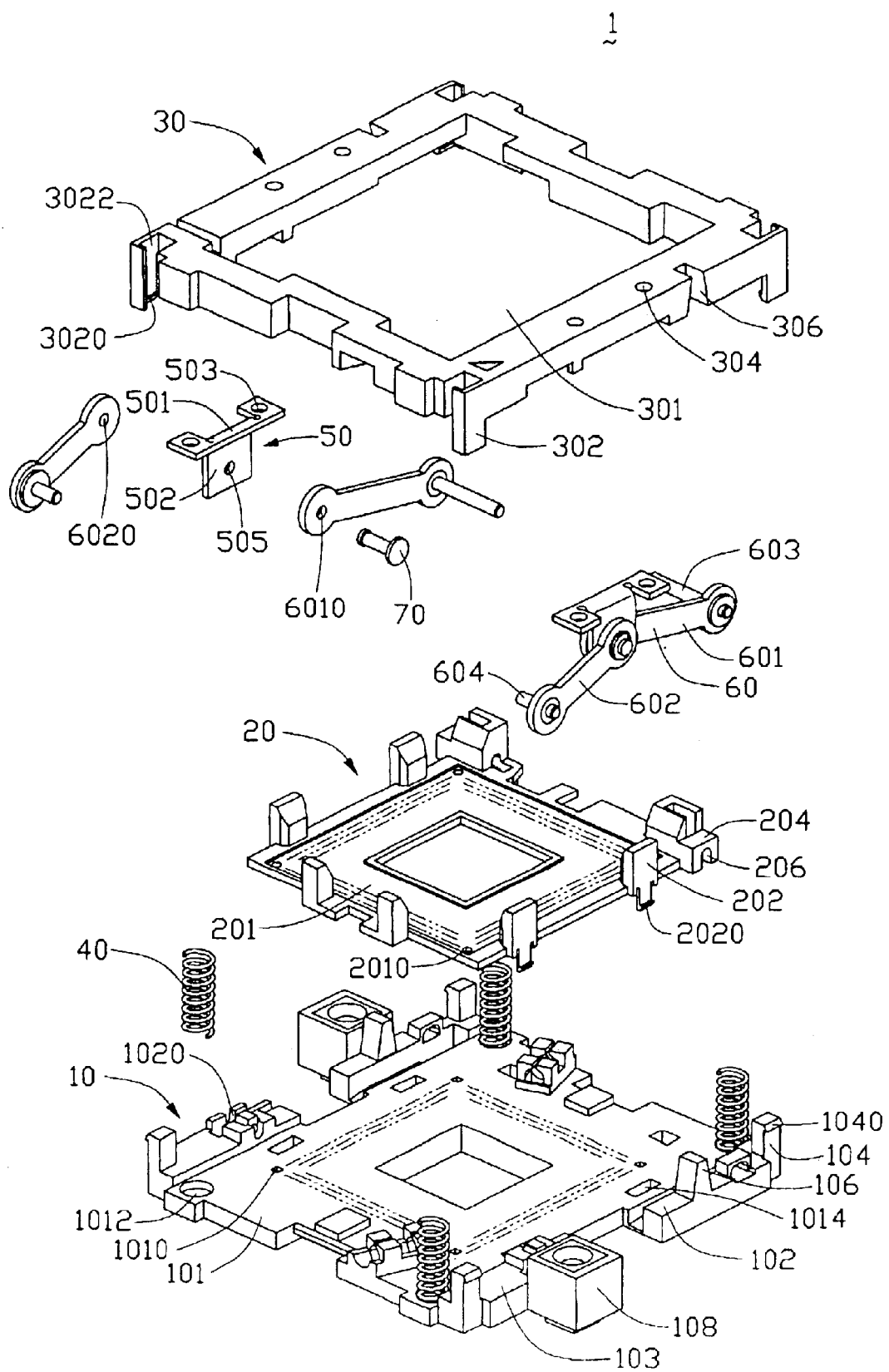
FIG. 1 is a simplified, exploded isometric view of a socket connector in accordance with the preferred embodiment of the present invention.

Referring to FIG. 1, a socket connector 1 in accordance with the preferred embodiment of the present invention is adapted for receiving an integrated circuit (IC) package such as a central processing unit (CPU) (not shown) in order to test the CPU. The socket connector 1 comprises a generally rectangular base 10 fixed on a circuit substrate such as a printed circuit board (PCB) (not shown), a generally rectangular cover 20 slidably mounted on the base 10, a lid 30, four coil springs 40, a pair of insert plates 50, and a pair of operating members 60 for actuating horizontal movement of the cover 20.

The cover 20 comprises a main body 201 for receiving the CPU thereon A plurality of passages 2010 is defined in the main body 201 in a rectangular array, for extension therethrough of a plurality of leads of the CPU. A pair of spaced, aligned projections 204 is formed on one end of the cover 20. A pair of first receiving grooves 206 is defined in bottoms of the projections 204 respectively. The main body 201 defines four sidewalls not labeled). Each of two opposite lateral sidewalls forms a pair of spaced, aligned latch portions 202. Each latch portion 202 has a hook portion 2020 at a bottom end thereof.

The base 10 comprises a rectangular main portion 101, a pair of first side portions 102 at opposite lateral sides of the main portion. 101 respectively, and a pair of second side portions 103 also at opposite lateral sides of the main portion 101 respectively. The first side portions 102 are spaced from the corresponding second side portions 103. The main portion 101 defines a plurality of passageways 1010 corresponding to the passages 2010 of the cover 20, and four blind holes 1012 in four corners thereof for receiving the coil springs 40 respectively. A plurality of conductive terminals (not shown) is received in the corresponding passageways 1010. A pair of spaced, aligned retaining slots 1014 is defined in each of the opposite lateral sides of the main body 101, for receiving corresponding latch portions 202 of the cover 20. A pair of first latches 104 is formed on the first side portions 102 respectively, and another pair of first latches 104 is formed on the second side portions 103 respectively. Each first latch 104 has a first hook protrusion 1040 protruding outwardly from a top end thereof. A pair of tapered tenons 106 extends upwardly from the first side portions 102 respectively. A pair of diagonally opposite columns 108 protrudes from one first side portion 102 and one second side portion 103 respectively, for fixing the base 10 on the PCB.

A pair of second receiving grooves 1020 is defined in the second end portions 103 respectively, one of the second receiving grooves 1020 being adjacent one of the columns 108.

The lid 30 is substantially a rectangular frame, and defines a central opening 301 corresponding to the main body 201 of the cover 20. The CPU is inserted and removed through the opening 301. Four blind holes (not shown) are defined in four corners of a bottom of the lid 30 respectively, corresponding to the blind holes 1012 of the base 10. Each of opposite lateral sidewalls (not labeled) of the lid 30 defines a pair of spaced first mounting holes 304, for fastening a corresponding insert plate 50 thereunder. A pair of tapered cutouts 306 is defined in the lateral sidewalls respectively, corresponding to the tenons 106 of the base 10. A pair of second latches 302 depends from each opposite lateral sidewall, the second latches 302 corresponding to the first latches 104 of the base 10. Each second latch 302 has a second hook 3020 at a distal end thereof, the second hooks 3020 corresponding to the first hooks 1040 of the first latches 104. Each second latch 302 defines an inner guiding groove 3022, the guiding grooves 3022 receiving the first latches 104 therein.

Each insert plate 50 comprises a horizontal top plate 501, and a vertical middle plate 502 depending from a middle of the top plate 501. A pair of second mounting holes 503 is defined in opposite ends of the top plate 501 respectively. A pivot hole 505 is defined in the middle plate 502, for hinging engagement of a corresponding operating member 60 thereat.

Each operating member 60 comprises a first operating lever 601, a second operating lever 602, a first shaft 603 engaged with the first operating lever 601, and a second shaft 604 engaged with the second operating lever 602. The first operating lever 601 defines a first through hole 6010 in an end thereof, corresponding to the pivot hole 505 of a respective insert plate 50. The second operating lever 602 defines a second through hole 6020 in an end thereof, also corresponding to the pivot hole 505 of the respective insert plate 50. A pivot pin 70 is used for pivotably attaching the operating member 60 to the respective insert plate 50.

Figure 2:
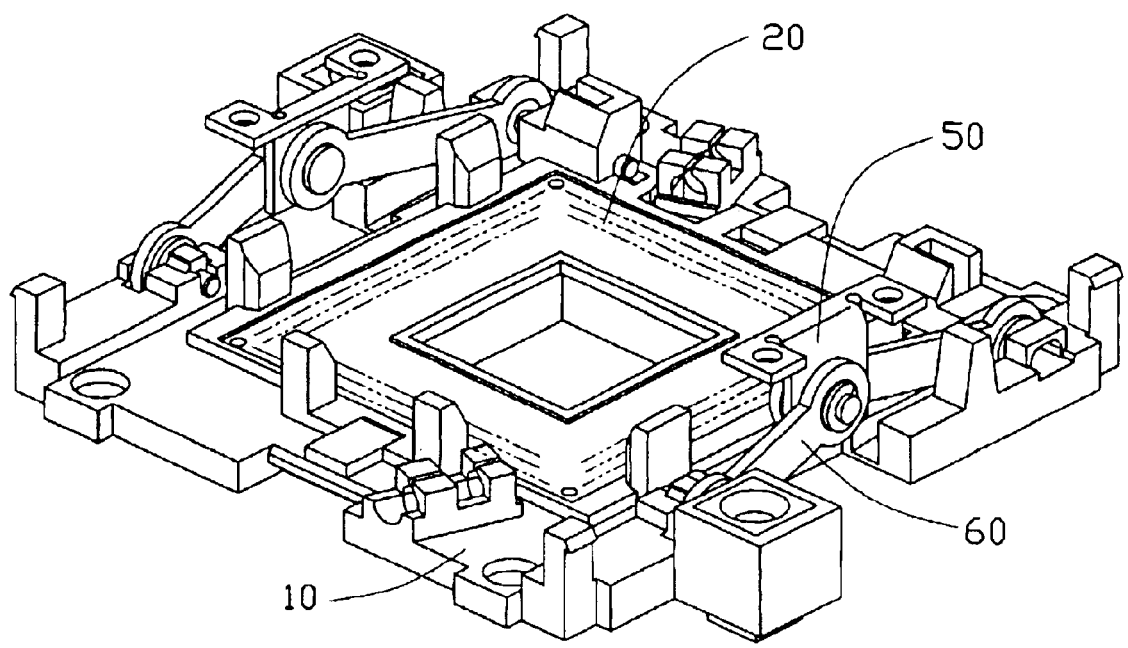
FIG. 2 is an assembled view of FIG. 1, but not showing a lid of the socket connector.
Figure 3:
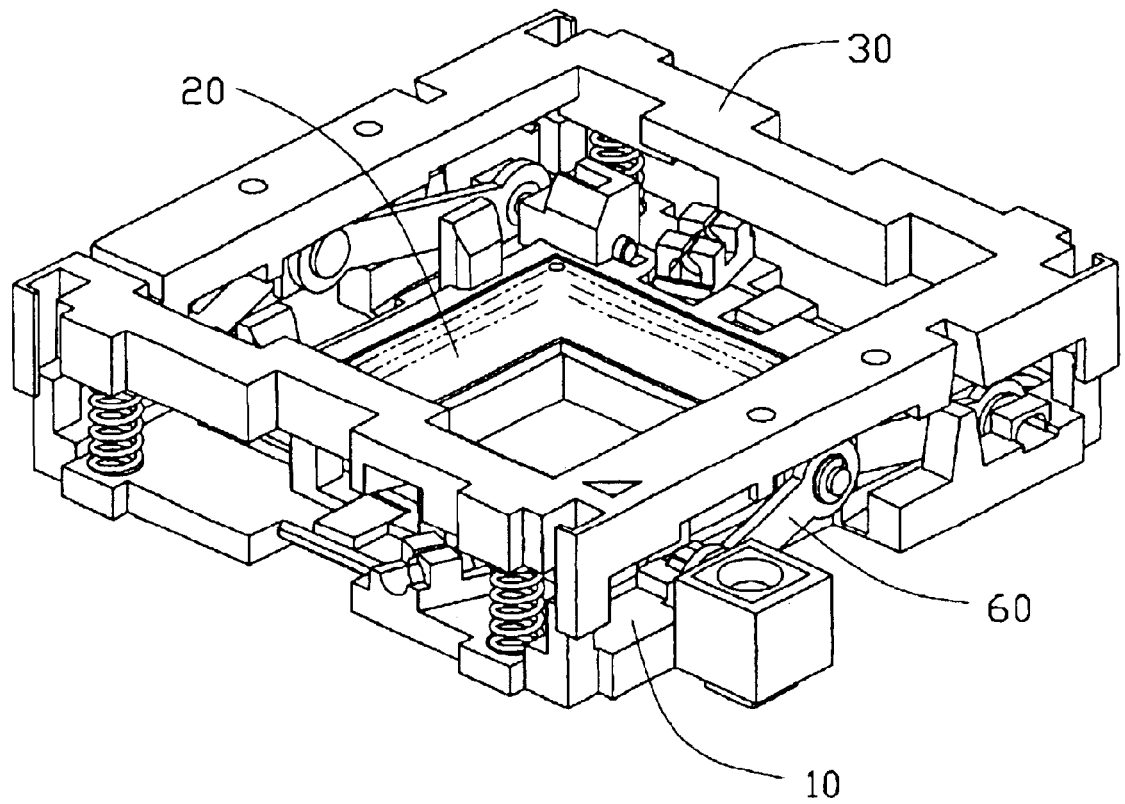
FIG. 3 is a complete assembled view of FIG. 1.

Referring to FIGS. 2 and 3, in assembly, the cover 20 is placed on the base 10. The second shafts 604 of the operating members 60 are pivotably received in the second receiving grooves 1020 of the base 10, and the first shafts 603 of the operating members 60 are pivotably received in the first receiving grooves 206 of the cover 20. The first and second operating levers 601, 602 are pivotably attached to their respective insert plates 50 by respective pivot pins 70. The insert plates 50 are mounted to undersides of the lateral sidewalls of the lid 30 respectively. The coil springs 40 are mounted between the lid 30 and the base 10. The lid 30 is thereby disposed above the operating members 60, and movably engaged on the base 10. The lid 30 is vertically movable relative to the base 10.

Figure 4:
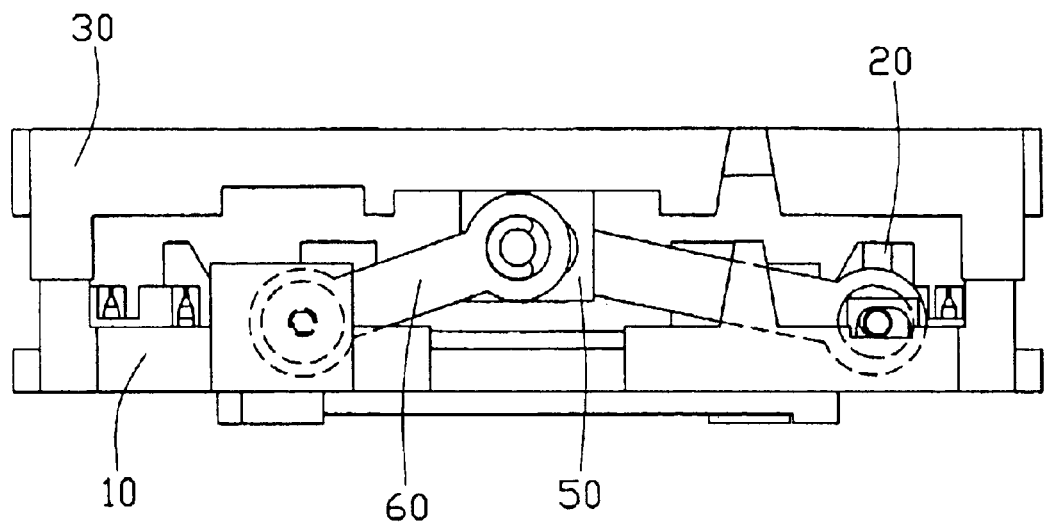
FIG. 4 is a side elevation view of FIG. 3, showing a cover and a pair of operating members of the socket connector in respective first positions.

Referring to FIG. 4, the socket connector 1 is in a relaxed state, with the cover 20 and the operating members 60 defined to be in respective first positions. In use, the CPU is inserted through the opening 301 of the lid 30 and engaged on the cover 20. The leads of the CPU are received through the passages 2010 of the cover 20, and then in the passageways 1010 of the base 10 with zero insertion force (ZIF). That is, the leads of the CPU do not contact the terminals (not shown) of the base 10.

Figure 5:
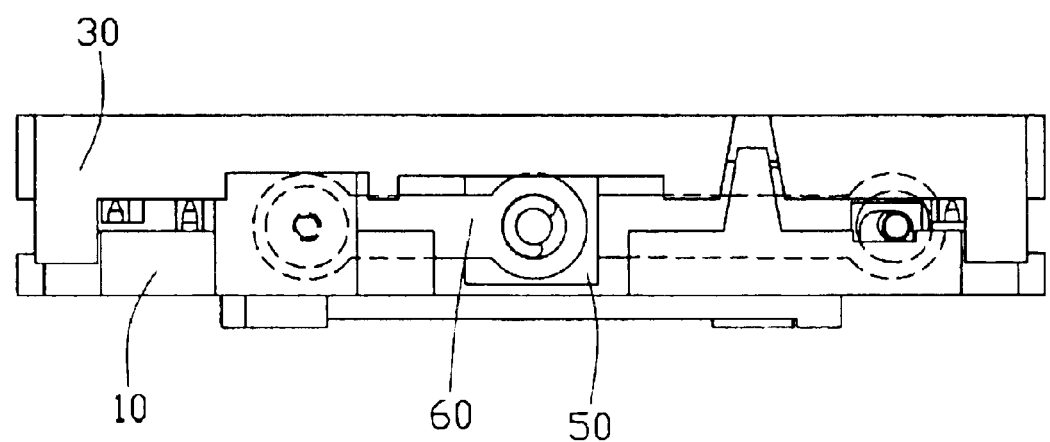
FIG. 5 is similar to FIG. 4, but showing the cover and the operating members in respective second positions.
Figure 6:
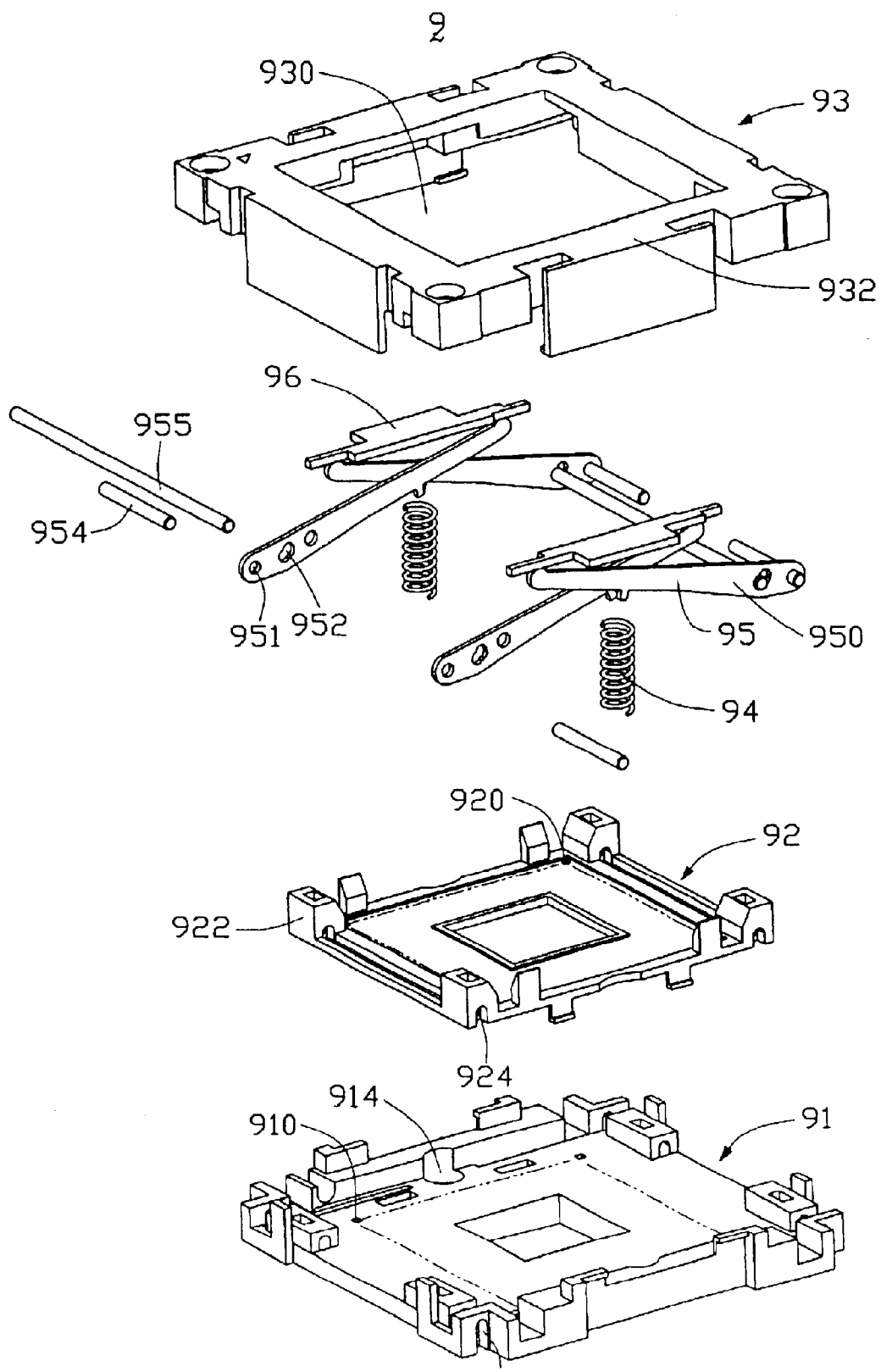
FIG. 6 is a simplified, exploded isometric view of a conventional connector.
Figure 7:
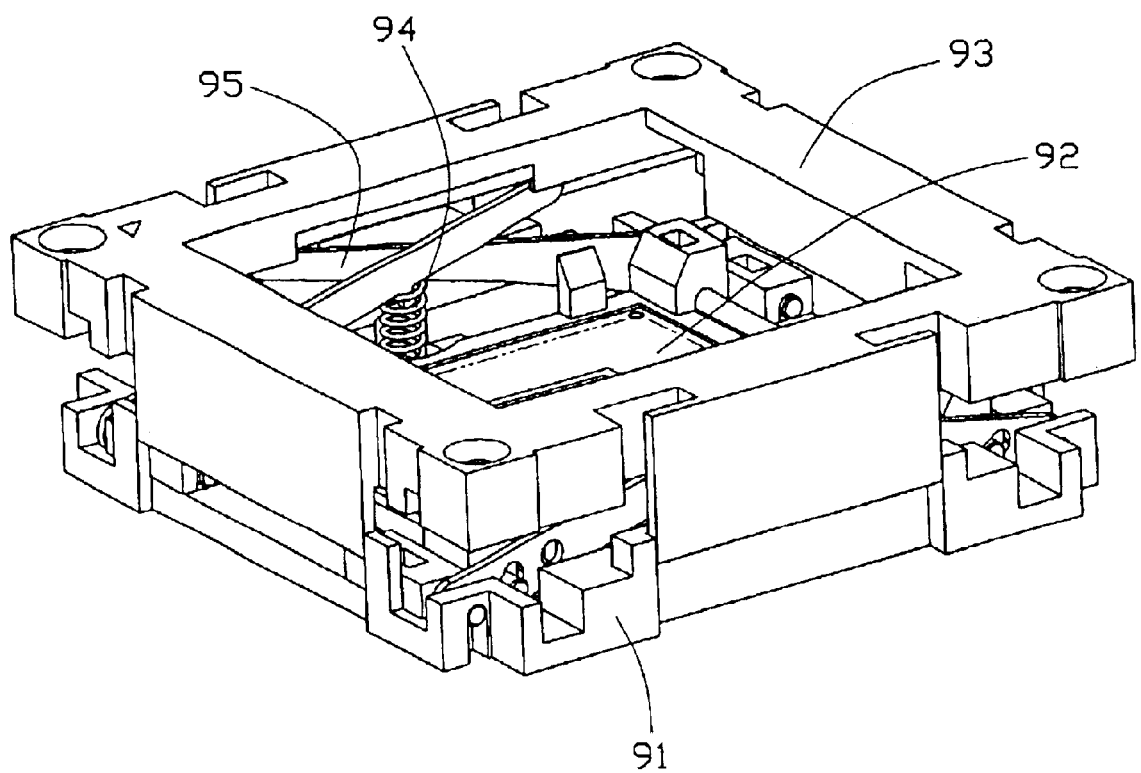
FIG. 7 is an assembled view of FIG. 6.

Referring to FIG. 5, when the lid 30 is pushed downwardly by an external force, corresponding force is applied to the first and second operating levers 601, 602. The first and second operating levers 601, 602 are pivoted downwardly about the first and second shafts 603, 604 at the pivot pins 70. The first and second operating levers 601, 602 cooperatively translate such pivotal movement into horizontal force acting on the first shafts 603. Thus, the first shafts 603 drive the cover 20 to slide horizontally from the first position to a second position in which the leads of the CPU engage with the terminals of the base 10. When the cover slides from the first position to the second position, the coil springs 40 are compressed. In addition, the tenons 106 of the base 10 are received in the cutouts 306 of the lid 30, thereby preventing lateral movement of the lid 30 relative to the base 10. When said downward force is released, the coil springs 40 decompress and drive the lid 30 upwardly. The first shafts 603 accordingly drive the cover 20 to slide back from the second position to the first position.

The socket connector 1, unlike conventional socket connectors, provides for insertion of the leads of the CPU into the passageways 1010 of the base 10 when the socket connector 1 is in a relaxed state. That is, when the cover 20 is in the first position. This ensures that the leads of the CPU are received in the passageways 1010 of the base 10 with ZIF. Similarly, after testing of the CPU, the socket connector 1 is returned to the first position by decompression of the coil springs 40. This ensures that the leads of the CPU can be removed from the passageways 1010 with zero removal force. Thus, the leads of the CPU are protected from damage during both engagement and disengagement of the CPU on and from the socket connector 1. In addition, if said downward force is insufficient, the cover 20 is driven only part of the way toward the closed state. Because the IC package is already attached on the cover 20, the leads of the IC package do not sustain damage when they are only partly engaged with the terminals of the base 10. Furthermore, in the closed state, if said downward force is released suddenly, the coil springs 40 rapidly decompress and drive the lid 30 upwardly, and the cover 20 is quickly driven to the open state. When this happens, the leads of the IC package exit the terminals of the base 10. Rapid exiting of the leads from the terminals is less likely to cause damage thereto compared with rapid entering of the leads into the terminals as in conventional art. Moreover, the second shafts 603 are pivotably engaged with the base 10, while the first shafts 604 are pivotably engaged with the cover 20. Thus, the above-described sliding of the cover 20 relative to the base 10 can be performed smoothly and easily without retardation or interruption.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A connector for receiving an integrated circuit (IC) package, the connector comprising:
   a base defining a plurality of passageways receiving a plurality of conductive terminals therein;
   a cover slidably mounted on the base;
   at least one operating member for actuating the cover to move relative to the base, the at least one operating member comprising a pair of operating levers, one of the operating levers engaged with the cover and the other operating lever engaged with the base;
   a lid engaged with the at least one operating member for pivotably moving the operating levers in a pivotal movement; and
   a plurality of coil springs connected between the lid and the base;
   wherein when no external force is exerted on the lid, the terminals in the base permit zero insertion force insertion and removal of leads of the IC package.

2. The connector as described in claim 1, further comprising a pair of insert plates mounted to the lid, and wherein the connector comprises a pair of operating members pivotably mounted to the corresponding insert plates.

3. The connector as described in claim 2, wherein each operating member comprises a first shaft engaged with the cover, a second shaft engaged with the base, a first operating lever attached to the first shaft, and a second operating lever mounted to the second shaft.

4. The connector as described in claim 3, wherein a downward movement of the operating members causes a pivoting movement of the first and second operating levers to move the cover relative to the base thereby connecting the terminals with the leads of the IC package.

5. The connector as described in claim 1, wherein the base comprises four first latches each having a first hook, and the lid comprises four second latches each having a second hook, the second latch and the second hook respectively corresponding to the first latch and the first hook.

6. The connector as described in claim 5, wherein a pair of opposite tenons is formed on the base, and a pair of cutouts is defined in the lid corresponding to the tenons, the tenons engaged with the cutouts thereby restraining the lid to move only in a vertical direction.

7. The connector as described in claim 1, wherein the base comprises a main portion defining four retaining slots, and four blind holes for receiving the coil springs.

8. The connector as described in claim 7, wherein the cover comprises four latch portions received in the retaining slots.

9. The connector as described in claim 8, wherein the cover defines a pair of first receiving grooves for receiving the first shafts of the operating members, and the base defines a pair of second receiving grooves for receiving the second shafts of the operating members.

10. A connector for receiving and testing a central processing unit (CPU), the connector comprising:
    a base defining a plurality of passageways receiving a plurality of conductive terminals therein;
    a cover slidably mounted on the base;
    a pair of operating members actuating the cover to move relative to the base, each of the operating members comprising a first operating lever engaged with the cover and a second operating lever engaged with the base;
    a lid movably engaged with the base;
    a pair of insert plates fastened to the lid and pivotably engaged with the operating members, thereby the lid engaged with the operating members for pivotably moving the first and second operating levers; and
    a plurality of coil springs connected between the lid and the base;
    wherein when no external force is exerted on the lid, the terminals in the base permit zero insertion force insertion and removal of leads of the CPU, and when the lid is pushed downwardly by an external force, the operating members actuate the cover to move relative to the base thereby connecting the terminals with the leads of the CPU.

11. The connector as described in claim 10, wherein the operating member comprises a first shaft engaged with the first operating lever, and a second shaft engaged with the second operating lever.

12. The connector as described in claim 10, wherein the cover defines a pair of first receiving grooves for receiving the first shafts of the operating members, and the base defines a pair of second receiving grooves for receiving the second shafts of the operating members.

13. An electrical connector comprising:

an insulative base with a plurality of terminals therein;

an insulative cover being slidable upon the base and defining a plurality of through holes in vertical alignment with the corresponding terminals, respectively;

a lid located upon the cover and restrictively vertically moveable with regard to the base;

a plurality of springs located on a periphery of the base to provide biasing forces between the base and the lid; and a plurality of operating members each located on a middle portion of each side of the lid and between the lid and the cover to convert up-and-down movement of the lid to back-and-forth movement of the cover; wherein when the lid is located in an upper position vertically, the cover is located in an opening position horizontally for allowing zero insertion or withdrawal of an electronic package relative to the connector, while when the lid is downwardly moved to a lower position vertically, the cover is moved to a closed position horizontally for having the electronic package mechanically and electrically connecting to the terminals.

14. The connector as described in claim 13, wherein each of said operating members is discrete and spaced from the springs.

15. The connector as described in claim 14, wherein said springs are respectively located on corners of the base.

* * * * *